US008854148B1

(12) United States Patent
Abuelma'atti

(10) Patent No.: US 8,854,148 B1
(45) Date of Patent: Oct. 7, 2014

(54) PROGRAMMABLE SINUSOIDAL OSCILLATOR CIRCUIT

(71) Applicant: King Fahd University of Petroleum and Minerals, Dhahran (SA)

(72) Inventor: Muhammad Taher Abuelma'atti, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/095,999

(22) Filed: Dec. 3, 2013

(51) Int. Cl.
*H03B 5/24* (2006.01)
*H03B 5/26* (2006.01)

(52) U.S. Cl.
CPC ........................ *H03B 5/24* (2013.01)
USPC ...................... 331/135; 331/108 B

(58) Field of Classification Search
CPC .............. H03B 5/20; H03B 5/24; H03B 5/26; H03B 2200/0046; H03B 2200/0058; H03B 2200/0094; H03B 2200/0096; H03B 2201/0275
USPC .......... 331/108 B, 135, 136, 137, 177 R, 173; 327/552
See application file for complete search history.

(56) References Cited

U.S. PATENT DOCUMENTS

| | | | |
|---|---|---|---|
| 5,564,089 A | 10/1996 | Barrett, Jr. | |
| 6,222,418 B1 | 4/2001 | Gopinathan et al. | |
| 6,472,945 B1 * | 10/2002 | Gumm | 331/138 |
| 7,429,889 B2 | 9/2008 | Kasperkovitz | |
| 8,264,289 B2 | 9/2012 | Chang et al. | |
| 8,604,887 B1 * | 12/2013 | Abuelma'Atti | 331/108 B |
| 2012/0161891 A1 | 6/2012 | Kamat et al. | |

OTHER PUBLICATIONS

Salama, K. N., and A. M. Soliman., "Novel oscillators using the operational transresistance amplifier", Microelectronics Journal 31.1 (2000), pp. 39-47.*
Raj Senani, D. R. Bhaskar, A. K. Singh, and V. K. Singh, "Current Feedback Operational Amplifiers and Their Applications", Springer, Feb. 20, 2013, Chapter 5, pp. 131-179.*
Abuelma'atti, Muhammad Taher, A. A. Farooqi, and S. M. Alshahrani, "Novel RC oscillators using the current-feedback operational amplifier", Circuits and Systems I: Fundamental Theory and Applications, IEEE Transactions on 43.2 (1996), pp. 155-157.*
Abuelma'atti, Muhammad T., Al-Shahrani, Sa'ad M., "Synthesis of a Novel Low-Component Programmable Sinusoidal Oscillator," Active and Passive Electronic Components, vol. 26 (2003), Issue 1, pp. 31-36.
Abuelma'atti, Muhammad T., "New two CFOA-based sinusoidal RC oscillators with buffered outlet," Analog Integrated Circuits and Signal Processing, Mar. 2011, vol. 66, Issue 3, pp. 475-482.
Abuelma'atti, Muhammad T., "Identification of a class of two CFOA-based sinusoidal RC oscillators," Analog Integrated Circuits and Signal Processing, Dec. 2010, vol. 65, Issue 3, pp. 419-428.

(Continued)

*Primary Examiner* — Ryan Johnson
(74) *Attorney, Agent, or Firm* — Richard C. Litman

(57) ABSTRACT

A programmable sinusoidal oscillator circuit is a sinusoidal oscillator circuit that includes a current-feedback operational-amplifier (CFOA) operably connected to two operational transconductance amplifiers (OTAs), two capacitors and a resistor. The programmable sinusoidal oscillator circuit enjoys electronic orthogonal tuning of the frequency and the condition of oscillation by adjusting the biasing currents (voltages) of the OTAs, as well as providing a low output impedance.

11 Claims, 2 Drawing Sheets

(56) References Cited

OTHER PUBLICATIONS

Bhaskar, D. R., Senani, Raj, "New CFOA-Based Single-Element-Controlled Sinusoidal Oscillators," IEEE Transactions on Instrumentation and Measurement, vol. 55, No. 6, pp. 2014-2021, Dec. 2006.

Sagbas M., Ayten, U. E., Herencsar, N., Minaei S., "Current and Voltage Mode Multiphase Sinusoidal Oscillators Using CBTAs," Radioengineering, vol. 22, No. 1, pp. 24-33, Apr. 2013.

Soliman, Ahmed M., "Current Feedback Operational Amplifier Based Oscillators," Analog Integrated Circuits and Signal Processing, vol. 23, Issue 1, pp. 45-55, Apr. 2000.

* cited by examiner

PROGRAMMABLE SINUSOIDAL OSCILLATOR CIRCUIT

BACKGROUND OF THE INVENTION

1. Field of the Invention

The present invention relates to oscillator circuitry and, particularly, to a programmable sinusoidal oscillator circuit including a current feedback operational amplifier (CFOA) combined with operational transconductance amplifiers (OTAs).

2. Description of the Related Art

Previous work of the present inventor has presented circuits for realizing a sinusoidal oscillator, using one current-feedback operational amplifier (CFOA), one operational transconductance amplifier (OTA), three grounded capacitors and one floating resistor. This previous circuit enjoys several attractive features, yet it would be desirable to further minimize the component requirements.

Thus, a programmable sinusoidal oscillator addressing the aforementioned problems is desired.

SUMMARY OF THE INVENTION

Embodiments of a programmable sinusoidal oscillator circuit include a current feedback operational amplifier (CFOA) operably connected to two operational transconductance amplifiers (OTAs), two capacitors and a resistance. Embodiments of a programmable sinusoidal oscillator circuit enjoy electronic orthogonal tuning of the frequency and the condition of oscillation by adjusting the biasing currents (voltages) of the QTAs, as well as can provide a low output impedance.

These and other features of the present invention will become readily apparent upon further review of the following specification and drawings.

BRIEF DESCRIPTION OF THE DRAWINGS

Unless otherwise indicated, similar reference characters denote corresponding features consistently throughout the attached drawings.

DETAILED DESCRIPTION OF THE PREFERRED EMBODIMENTS

Figure 1:
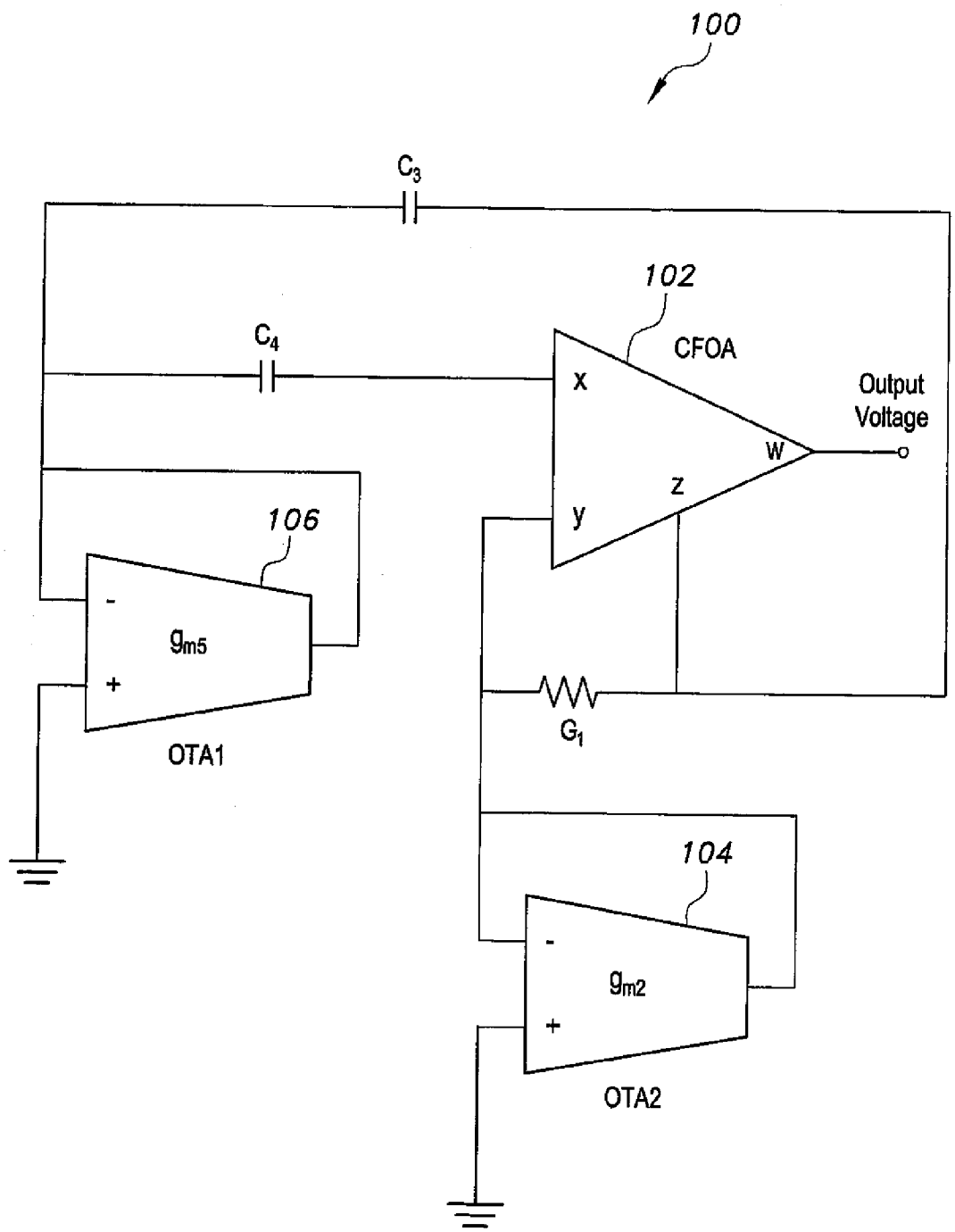
FIG. 1 is a block diagram of the programmable CFOA OTA sinusoidal oscillator circuit according to the present invention.

As shown in FIG. 1, an embodiment of a programmable sinusoidal oscillator circuit 100 includes a current feedback operational amplifier (CFOA) 102 operably connected to two operational transconductance amplifiers (OTAs), OTA1 104 and OTA2 106, two capacitors ($C_3$ and $C_4$) and an equivalent resistance formed by a conductance $G_1$. Embodiments of a programmable sinusoidal oscillator circuit, such as the programmable sinusoidal oscillator circuit 100, can enjoy electronic orthogonal tuning of the frequency and the condition of oscillation by adjusting the biasing currents (voltages) of the OTAs, as well can provide a low output impedance.

Figure 2:
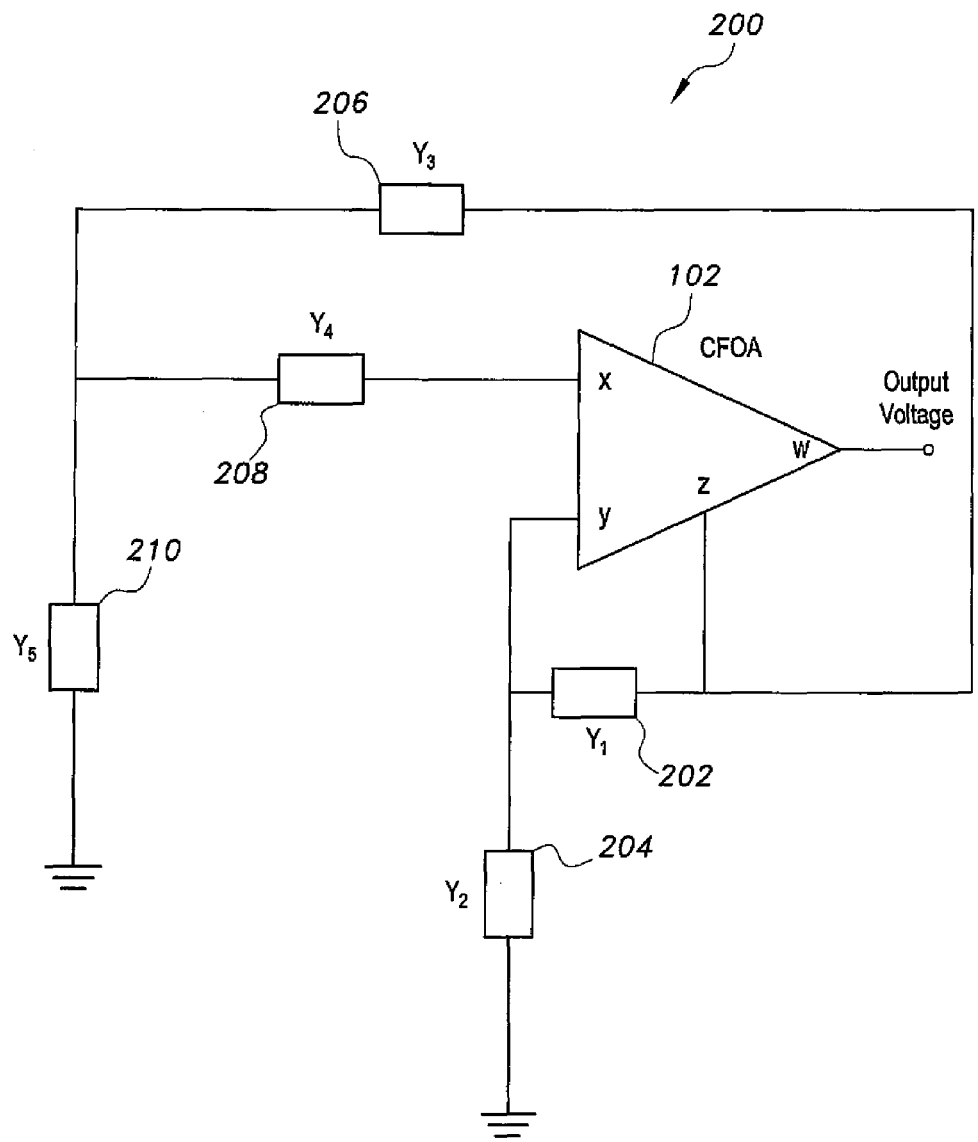
FIG. 2 is a block diagram of a generic sinusoidal oscillator as applied to the present invention.

The programmable sinusoidal oscillator circuit 100 of FIG. 1 is, in fact, a member of a family of oscillators that can be obtained from a generic sinusoidal oscillator circuit 200 shown in FIG. 2, as applied to embodiments of a programmable sinusoidal oscillator circuit. A characteristic relation of the oscillator structure of the generic sinusoidal oscillator circuit 200 of FIG. 2 can be expressed as:

$$Y_1Y_2(Y_3+Y_4+Y_5)+Y_1Y_5(Y_3-Y_4)+Y_2Y_3(2Y_4+Y_5)=0. \quad (1)$$

In the oscillator structure of the generic sinusoidal oscillator circuit 200, a current divider including an admittance $Y_5$ 210 and an admittance $Y_4$ 208 is configured with one terminal of the admittance $Y_5$ 210 connected to ground and a terminal of the admittance $Y_4$ 208 connected to an inverting input (x) of the CFOA 102, and a current split terminal between the admittance $Y_5$ 210 and the admittance $Y_4$ 208. Another current divider including an admittance $Y_2$ 204 and an admittance $Y_1$ 202 is configured with one terminal of the admittance $Y_2$ 204 connected to ground, a current split terminal between the admittance $Y_1$ 202 and the admittance $Y_2$ 204 connected to a non-inverting (y) input of the CFOA 102, and a remaining terminal of the admittance $Y_1$ 202 connected to a z output of the CFOA 102 and to a feedback admittance $Y_3$ 206 which connects to the current split terminal of the current divider pair of the admittances $Y_4$ 208 and $Y_5$ 210.

In embodiments of a programmable sinusoidal oscillator circuit, the CFOA 102 has the x (inverting) input and the y (non-inverting) input, the z output terminal and a w output terminal. An end terminal of a first current divider is connected to the x input, the first current divider including the admittance $Y_5$ and an input coupling admittance, the admittance $Y_4$, and a split terminal of a second current divider is connected to the y input, the second current divider including the admittances $Y_1$ and $Y_2$. A coupling admittance element, the admittance $Y_3$, is connected in a feedback configuration to a split terminal of the first current divider and an end terminal of the second current divider, the end terminal of the second current divider being connected to the z output terminal of the CFOA 102. As illustrated in the programmable sinusoidal oscillator circuit 100, at least one admittance element of the programmable sinusoidal oscillator circuit is an active transconductance element, such as the OTAs 104 and 106, and the passive elements in the programmable sinusoidal oscillator circuit are passive capacitive elements, such as the capacitances $C_3$ and $C_4$, and oscillations generated by the programmable sinusoidal oscillator circuit 100 appear at the w output terminal, the w output terminal having a low output impedance.

Using relation (1) other embodiments of CFOA-OTA-based oscillator circuits can be obtained. In the practical implementation of the oscillators derived from the oscillator structure of the generic sinusoidal oscillator circuit 200 of FIG. 2 it can be desirable to replace every grounded conductance by an OTA configured as a positive conductance. It is also possible to replace a floating conductance by two OTAs configured to provide a floating conductance, for example. Thus, embodiments of oscillator circuits can be considered as active-C circuits as they can typically use only active elements and capacitors, for example. Such embodiments of oscillator circuits can be very attractive for integrated circuit (IC) fabrication, as can avoid the use of physical resistors which can result in a reduced area on the chip.

In embodiments of a programmable sinusoidal oscillator circuit, such as the programmable sinusoidal oscillator circuit 100, assuming that the CFOA 102 and the OTAs 104 and 106 are ideal, with $i_x=i_z, i_y=0$ and $v_x=v_y$, for the CFOA 102 and $i_{out}=g_m(v_+-v_-)$, and $i_+=i_-=0$ for the OTAs 104 and 106, routine analysis yields a characteristic relation of this configuration given by:

$$G_1g_{m5}C_4=G_1g_{m2}(C_3+C_4)+g_{m5}C_3(G_1+g_{m2}), \quad (2)$$

Using the Barkhausen criterion, the frequency of oscillation and the condition of oscillation of the programmable sinusoidal oscillator circuit 100 of FIG. 1 can be expressed as:

$$\omega_0^2 = \frac{G_1 g_{m5}}{2C_3 C_4} \quad (3)$$

and $$G_1 g_{m5} C_4 = G_1 g_{m2}(C_3+C_4) + g_{m5} C_3 (G_1+g_{m2}) \quad (4)$$

In relations (3) and (4), $\omega_0$ is the oscillation frequency in radians/second, $G_1$ is a conductance provided by the admittance $Y_1$, $g_{m5}$ is the transconductance of an OTA configured as the admittance $Y_5$, $C_3$ is a feedback coupling capacitor configured as the admittance $Y_3$ as a coupling admittance element, and $C_4$ is an input coupling capacitor configured as the admittance $Y_4$ as an input coupling admittance, and $g_{m2}$ is the transconductance of an OTA configured as the admittance $Y_2$.

Inspection of relations (3) and (4) shows that the condition of oscillation can be electronically tuned by adjusting the transconductance $g_{m2}$ without substantially disturbing the frequency of oscillation. However, the latter typically cannot be adjusted without disturbing the former. Thus, embodiments of a programmable sinusoidal oscillator circuit, such as the programmable sinusoidal oscillator circuit 100, can be orthogonally tuned first by controlling $g_{m5}$ until the required frequency of oscillation is obtained and then the condition of oscillation is adjusted by controlling $g_{m2}$ until oscillations start up and sustain at an output terminal w of the CFOA 102. Also, since the transconductances $g_{m2}$ and $g_{m5}$ can be electronically tuned by adjusting the bias currents (voltages) of the OTAs, then embodiments of a programmable sinusoidal oscillator circuit, such as the programmable sinusoidal oscillator circuit 100, can enjoy orthogonal electronic tuning of the frequency and the condition of oscillation, for example.

Moreover, embodiments of the programmable sinusoidal oscillator circuit, such as the programmable sinusoidal oscillator circuit 100, can enjoy a low output impedance at the terminal w of the CFOA 102. Thus, embodiments of a programmable sinusoidal oscillator circuit, such as the programmable sinusoidal oscillator circuit 100, can be relatively easily connected to relatively low impedance loads, for example.

It is to be understood that the present invention is not limited to the embodiments described above, but encompasses any and all embodiments within the scope of the following claims.

I claim:

1. A programmable sinusoidal oscillator circuit, comprising:
   a current feedback operational amplifier (CFOA) having an x inverting input and a y non-inverting input, a z output terminal and a w output terminal;
   an end terminal of a first current divider connected to the x input, the first current divider including an admittance $Y_5$ and an input coupling admittance $Y_4$;
   a split terminal of a second current divider connected to the y input, the second current divider including admittances $Y_1$ and $Y_2$; and
   a coupling admittance element $Y_3$ being connected in a feedback configuration to a split terminal of the first current divider and an end terminal of the second current divider, the end terminal of the second current divider being connected to the z output terminal of the CFOA,
   wherein at least one admittance element of the programmable sinusoidal oscillator circuit is an active transconductance element, at least one admittance element of the programmable sinusoidal oscillator circuit is a passive element, the passive elements in the programmable sinusoidal oscillator circuit are passive capacitive elements, and oscillations generated by the programmable sinusoidal oscillator circuit appear at the w output terminal, the w output terminal having a low output impedance.

2. The programmable sinusoidal oscillator circuit according to claim 1, wherein said circuit is characterized by the relation:

$$Y_1 Y_2 (Y_3+Y_4+Y_5) + Y_1 Y_5 (Y_3-Y_4) + Y_2 Y_3 (2Y_4+Y_5) = 0.$$

3. The programmable sinusoidal oscillator circuit according to claim 2, wherein said active transconductance element is an operational transconductance amplifier (OTA) configured as a positive conductance.

4. The programmable sinusoidal oscillator circuit according to claim 3, wherein said OTA corresponds to a grounded conductance in the programmable sinusoidal oscillator circuit.

5. The programmable sinusoidal oscillator circuit according to claim 4, further comprising:
   a pair of OTAs configured to correspond to a floating conductance in the programmable sinusoidal oscillator circuit.

6. The programmable sinusoidal oscillator circuit according to claim 4, wherein a frequency of oscillation of the programmable sinusoidal oscillator circuit is characterized by the relation:

$$\omega_0^2 = \frac{G_1 g_{m5}}{2C_3 C_4},$$

where $\omega_0$ is the oscillation frequency in radians/second, $G_1$ is a conductance provided by the admittance $Y_1$, $g_{m5}$ is the transconductance of an OTA configured as the admittance $Y_5$, $C_3$ is a feedback coupling capacitor configured as the admittance $Y_3$ as the coupling admittance element, and $C_4$ is an input coupling capacitor configured as the admittance $Y_4$ as the input coupling admittance.

7. The programmable sinusoidal oscillator circuit according to claim 6, wherein a condition of oscillation of the programmable sinusoidal oscillator circuit is characterized by the relation:

$$G_1 g_{m5} C_4 = G_1 g_{m2}(C_3+C_4) + g_{m5} C_3 (G_1+g_{m2}),$$

where $g_{m2}$ is the transconductance of an OTA configured as the admittance $Y_2$.

8. The programmable sinusoidal oscillator circuit according to claim 7, wherein the OTA configured as the admittance $Y_5$ and the OTA configured as the admittance $Y_2$ of the programmable sinusoidal oscillator circuit are configured so that their transconductances are electronically tunable via adjustable bias currents applied to the corresponding OTA.

9. The programmable sinusoidal oscillator circuit according to claim 6, wherein one or more OTAs of the programmable sinusoidal oscillator circuit are configured so that a corresponding transconductance is electronically tunable via adjustable bias currents applied to the corresponding OTA.

10. The programmable sinusoidal oscillator circuit according to claim 4, wherein a condition of oscillation of the programmable sinusoidal oscillator circuit is characterized by the relation:

$$G_1 g_{m5} C_4 = G_1 g_{m2}(C_3+C_4) + g_{m5} C_3 (G_1 + g_{m2}),$$

where $G_1$ is a conductance provided by the admittance $Y_1$, $g_{m2}$ is the transconductance of an OTA configured as the admittance $Y_2$, $C_3$ is a feedback coupling capacitor configured as the admittance $Y_3$ as the coupling admittance element, $C_4$ is an input coupling capacitor configured as the admittance $Y_4$ as the input coupling admittance, and $g_{m5}$ is the transconductance of the OTA configured as the admittance $Y_5$.

11. The programmable sinusoidal oscillator circuit according to claim 10, wherein the OTA configured as the admittance $Y_5$ and the OTA configured as the admittance $Y_2$ of the programmable sinusoidal oscillator circuit are configured so that their transconductances are electronically tunable via adjustable bias currents applied to the corresponding OTA.

\* \* \* \* \*